US006455382B1

(12) United States Patent
Lin et al.

(10) Patent No.: US 6,455,382 B1
(45) Date of Patent: Sep. 24, 2002

(54) MULTI-STEP METHOD FOR FORMING SACRIFICIAL SILICON OXIDE LAYER

(75) Inventors: Kwang-Ming Lin, Hsin Chu; Chih-Chung Lin, Yungkang, both of (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/848,599

(22) Filed: May 3, 2001

(51) Int. Cl.[7] .................................. H01L 21/336
(52) U.S. Cl. ........................ 438/296; 438/424
(58) Field of Search .................. 438/296, 424–426, 438/435, 437, 438, 444, 427, 228, 221, 701, 978, 692, 696, 702, 246, 359

(56) References Cited

U.S. PATENT DOCUMENTS

| 5,151,381 A | | 9/1992 | Liu et al. |
| 5,801,083 A | * | 9/1998 | Yu et al. ............ 148/DIG. 161 |
| 5,851,892 A | | 12/1998 | Lojek et al. |
| 5,976,936 A | * | 11/1999 | Miyajima et al. ........... 438/268 |
| 6,001,706 A | * | 12/1999 | Tan et al. .................... 438/228 |
| 6,051,479 A | * | 4/2000 | Hong .......................... 438/424 |
| 6,057,208 A | | 5/2000 | Lin et al. |
| 6,107,143 A | | 8/2000 | Park et al. |
| 6,265,292 B1 | * | 7/2001 | Parat et al. ................. 438/434 |
| 6,300,219 B1 | * | 10/2001 | Doan et al. ................. 438/424 |

* cited by examiner

Primary Examiner—David Nelms
Assistant Examiner—D. Vu
(74) Attorney, Agent, or Firm—Tung & Associates

(57) ABSTRACT

Within a method for forming a sacrificial silicon oxide layer, there is first provided a silicon semiconductor substrate. There is then thermally oxidized the silicon semiconductor substrate at a first temperature within a first oxidizing atmosphere to form a silicon oxide layer upon a partially consumed silicon semiconductor substrate formed from the silicon semiconductor substrate. There is then thermally oxidizing the partially consumed silicon semiconductor substrate at a second temperature greater than the first temperature, and within a second oxidizing atmosphere, to form from the silicon oxide layer upon the partially consumed silicon semiconductor substrate a further oxidized silicon oxide layer upon a further consumed silicon semiconductor substrate. Finally, there is then stripped from the further consumed silicon semiconductor substrate the further oxidized silicon oxide layer. By employing the method, microelectronic devices may be fabricated with enhanced performance within the further consumed silicon semiconductor substrate.

15 Claims, 2 Drawing Sheets

MULTI-STEP METHOD FOR FORMING SACRIFICIAL SILICON OXIDE LAYER

BACKGROUND OF THE INVENTION

1. Field of the Invention

The present invention relates generally to methods for forming silicon oxide layers within microelectronic fabrications. More particularly, the present invention relates to methods for forming sacrificial silicon oxide layers within microelectronic fabrications.

2. Description of the Related Art

Microelectronic fabrications are formed from microelectronic substrates over which are formed patterned microelectronic conductor layers which are separated by microelectronic dielectric layers.

Indigenous in the art of microelectronic fabrication for forming microelectronic dielectric layers within microelectronic fabrications is the use of silicon oxide dielectric materials for forming silicon oxide microelectronic dielectric layers within microelectronic fabrications. Silicon oxide dielectric materials are desirable in the art of microelectronic fabrication for forming silicon oxide microelectronic dielectric layers within microelectronic fabrications insofar as silicon oxide dielectric materials are: (1) readily fabricated employing various conventional methods as are employed for forming microelectronic layers within microelectronic fabrications; and (2) possess desirable physical properties and electrical properties when formed into silicon oxide microelectronic dielectric layers employed within microelectronic fabrications.

While silicon oxide dielectric materials are thus clearly desirable in the art of microelectronic fabrication for forming silicon oxide microelectronic dielectric layers within microelectronic fabrications, silicon oxide dielectric materials, and the resulting silicon oxide microelectronic dielectric layers formed therefrom, are nonetheless not entirely without problems within the art of microelectronic fabrication. In that regard, it is known in the art of microelectronic fabrication that various methods for forming silicon oxide microelectronic dielectric layers within microelectronic fabrications provide detrimental effects upon microelectronic structures formed within the microelectronic fabrications within which are formed the silicon oxide microelectronic dielectric layers formed of the silicon oxide dielectric materials.

It is thus desirable in the art of microelectronic fabrication to provide methods which may be employed for forming, with desirable properties, silicon oxide microelectronic dielectric layers within microelectronic fabrications.

It is towards the foregoing object that the present invention is directed.

Various methods have been disclosed in the art of microelectronic fabrication for forming silicon oxide microelectronic dielectric layers with desirable properties for various uses within microelectronic fabrications.

Included among the methods, but not limiting among the methods are those disclosed by: (1) Liu et al., in U.S. Pat. No. 5,151,381 (a two step thermal oxidizing method for forming a local oxidation of silicon (LOCOS) isolation region silicon oxide microelectronic dielectric layer within a semiconductor integrated circuit microelectronic fabrication with attenuated encroachment of a bird's beak within an active region of a semiconductor substrate within which is formed the local oxidation of silicon (LOCOS) isolation region silicon oxide microelectronic dielectric layer within the semiconductor integrated circuit microelectronic fabrication); (2) Lojek et al., in U.S. Pat. No. 5,851,892 (a multi-step thermal oxidizing method for forming a gate dielectric layer or tunnel dielectric layer silicon oxide microelectronic dielectric layer within a semiconductor integrated circuit microelectronic fabrication with minimized inducted charge and/or maximized breakdown voltage within the gate dielectric layer or tunnel dielectric layer silicon oxide microelectronic dielectric layer within the semiconductor integrated circuit microelectronic fabrication); (3) Lin et al., in U.S. Pat. No. 6,057,208 (a chemical vapor deposition (CVD) method for forming a sacrificial dielectric layer, such as but not limited to a sacrificial silicon oxide microelectronic dielectric layer, with desirable etch properties within a semiconductor integrated circuit microelectronic fabrication such as to avoid over-etching a trench liner layer formed within an isolation trench adjoining the sacrificial dielectric layer when stripping from a semiconductor substrate upon which is formed the sacrificial dielectric layer and within which is formed the trench the sacrificial dielectric layer); and (4) Park et al., U.S. Pat. No. 6,107,143 (a thermal annealing method for forming within an isolation trench within a semiconductor substrate employed within a semiconductor integrated circuit microelectronic fabrication a trench liner layer silicon oxide microelectronic dielectric layer having a lower etch rate than a trench filling layer silicon oxide microelectronic dielectric layer formed upon the trench liner layer silicon oxide microelectronic dielectric layer within the isolation trench employed within the semiconductor substrate employed within the semiconductor integrated circuit microelectronic fabrication).

Desirable in the art of microelectronic fabrication are additional methods which may be employed for forming within microelectronic fabrications silicon oxide microelectronic dielectric layers with desirable properties within microelectronic fabrications.

It is towards the foregoing object that the present invention is directed.

SUMMARY OF THE INVENTION

A first object of the present invention is to provide a method for forming within a microelectronic fabrication a silicon oxide layer.

A second object of the present invention is to provide a method for forming within the microelectronic fabrication the silicon oxide layer in accord with the first object of the present invention, wherein the silicon oxide layer is formed with desirable properties.

A third object of the present invention is to provide the method for forming within the microelectronic fabrication the silicon oxide layer in accord with the first object of the present invention and the second object of the present invention, wherein the method is readily commercially implemented.

In accord with the objects of the present invention, there is provided by the present invention a method for forming within a microelectronic fabrication a sacrificial silicon oxide layer.

To practice the method of the present invention, there is first provided a silicon semiconductor substrate. There is then thermally oxidized the silicon semiconductor substrate at a first temperature within a first oxidizing atmosphere to form a silicon oxide layer upon a partially consumed silicon semiconductor substrate formed from the silicon semiconductor substrate. There is then thermally oxidized the partially consumed silicon semiconductor substrate at a second temperature greater than the first temperature, and within a second oxidizing atmosphere, to form from the silicon oxide layer upon the partially consumed silicon semiconductor substrate a further oxidized silicon oxide layer upon a further consumed silicon semiconductor substrate. Finally, there is then stripped from the further consumed silicon semiconductor substrate the further oxidized silicon oxide layer, which comprises a sacrificial silicon oxide layer in accord with the present invention.

By employing for forming the sacrificial silicon oxide layer of the present invention the foregoing two step thermal oxidizing method which comprises: (1) a first thermal oxidizing step at a first temperature for forming from a silicon semiconductor substrate a silicon oxide layer formed upon a partially consumed silicon semiconductor substrate; and (2) a second thermal oxidizing step at a second temperature greater than the first temperature for forming from the silicon oxide layer upon the partially consumed silicon semiconductor substrate a further oxidized silicon oxide layer upon a further consumed silicon semiconductor substrate, where the further oxidized silicon oxide layer serves as the sacrificial silicon oxide layer, a microelectronic device formed within the further consumed silicon semiconductor substrate subsequent to stripping therefrom the further oxidized silicon oxide layer which serves as the sacrificial silicon oxide layer of the present invention may be formed with enhanced performance.

The present invention provides a method for forming within a microelectronic fabrication a silicon oxide layer, wherein the silicon oxide layer is formed with desirable properties.

The present invention realizes the foregoing objects by employing when forming a sacrificial silicon oxide layer in accord with the present invention a two step thermal oxidizing method which comprises: (1) a first thermal oxidizing step at a first temperature for forming from a silicon semiconductor substrate a silicon oxide layer formed upon a partially consumed silicon semiconductor substrate; and (2) a second thermal oxidizing step at a second temperature greater than the first temperature for forming from the silicon oxide layer upon the partially consumed silicon semiconductor substrate a further oxidized silicon oxide layer upon a further consumed silicon semiconductor substrate, where the further oxidized silicon oxide layer serves as the sacrificial silicon oxide layer. Within the present invention, a microelectronic device formed within the further consumed silicon semiconductor substrate subsequent to stripping therefrom the further oxidized silicon oxide layer which serves as the sacrificial silicon oxide layer of the present invention may be formed with enhanced performance, to thus provide within the context of the present invention the silicon oxide layer formed with desirable, and enhanced, properties.

The method of the present invention is readily commercially implemented.

The present invention employs methods and materials as are otherwise generally known in the art of microelectronic fabrication, and in particular known in the art of semiconductor integrated circuit microelectronic fabrication, but employed within the context of a specific process ordering and specific process limitations to provide the present invention. Since it is thus a specific process ordering and specific process limitations which provide at least in part the present invention, rather than the existence of methods and materials which provide the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronic fabrication a silicon oxide layer, wherein the silicon oxide layer is formed with desirable properties.

The present invention realizes the foregoing objects by employing when forming a sacrificial silicon oxide layer in accord with the present invention a two step thermal oxidizing method which comprises: (1) a first thermal oxidizing step at a first temperature for forming from a silicon semiconductor substrate a silicon oxide layer formed upon a partially consumed silicon semiconductor substrate; and (2) a second thermal oxidizing step at a second temperature greater than the first temperature for forming from the silicon oxide layer upon the partially consumed silicon semiconductor substrate a further oxidized silicon oxide layer upon a further consumed silicon semiconductor substrate, where the further oxidized silicon oxide layer serves as the sacrificial silicon oxide layer in accord with the present invention. Within the present invention, a microelectronic device formed within the further consumed silicon semiconductor substrate subsequent to stripping therefrom the further oxidized silicon oxide layer which serves as the sacrificial silicon oxide layer in accord with the present invention may be formed with enhanced performance, to thus provide within the context of the present invention the silicon oxide layer formed with desirable, and enhanced, properties.

Although the preferred embodiment of the present invention illustrates the present invention within the context of a sacrificial silicon oxide layer employed as an ion implantation mask layer when fabricating a semiconductor integrated circuit microelectronic fabrication, within the context of the present invention a sacrificial silicon oxide layer may be employed as a sacrificial layer including but not limited to a sacrificial ion implantation mask layer, a sacrificial gettering layer or any other type of sacrificial layer when fabricating a semiconductor integrated circuit microelectronic fabrication.

Similarly, although the preferred embodiment of the present invention illustrates the present invention within the context of forming, with enhanced performance, a field effect transistor (FET) device within an active region of a semiconductor substrate upon which had been formed and subsequently stripped a sacrificial silicon oxide layer in accord with the present invention, the present invention may be employed for forming, with enhanced performance, within an active region of a semiconductor substrate upon which had been formed and subsequently stripped a sacrificial silicon oxide layer formed in accord with the present invention microelectronic devices including but not limited to resistors, transistors, diodes and capacitors, which may be further defined and classified within the context of field effect devices, junction devices and passive devices.

Figure 1:
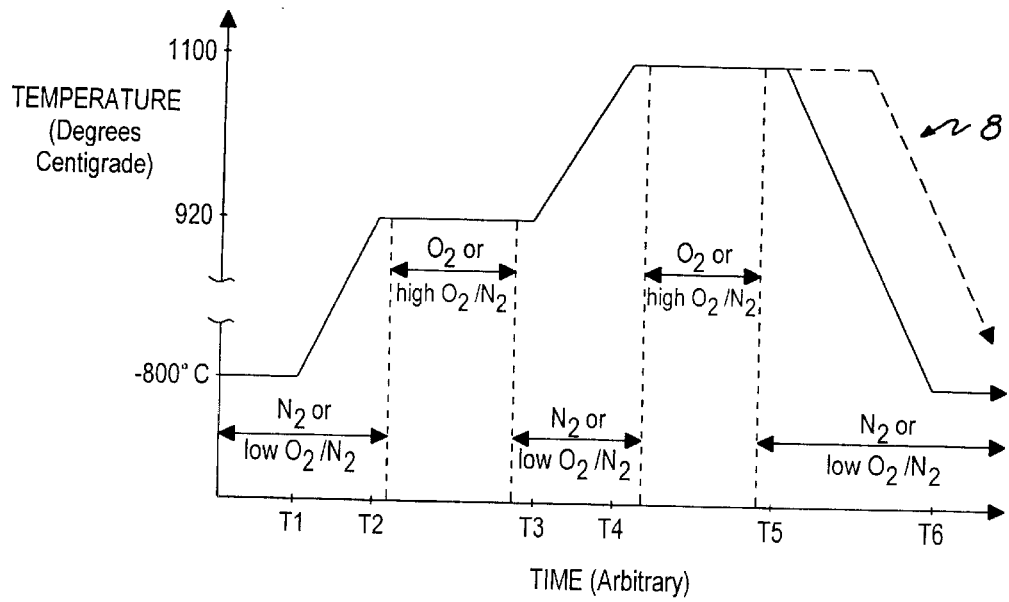
FIG. 1 shows a schematic process description diagram illustrating a series of process conditions employed for forming a sacrificial silicon oxide layer in accord a preferred embodiment of the present invention.

Referring now to FIG. 1, there is shown a schematic process description diagram illustrating a series of process conditions employed for forming a sacrificial silicon oxide layer in accord a preferred embodiment of the present invention.

Although not specifically illustrated within the schematic process description diagram of FIG. 1, the process which is described within the schematic process description diagram of FIG. 1 is typically and preferably undertaken within a thermal processing reactor chamber, such as but not limited to a thermal annealing furnace (having a comparatively lower thermal gradient capability of from about 4 to about 6 degrees centigrade per minute) or a rapid thermal processing (RTP) reactor chamber (having a comparatively higher thermal gradient capability of from about 100 to about 200 degrees centigrade per second), as is otherwise generally known in the art of semiconductor integrated circuit microelectronic fabrication. Similarly, and as is described in greater detail below, the method of the present invention is typically and preferably undertaken with respect to a monocrystalline silicon semiconductor substrate processed within the thermal processing reactor chamber, although the method of the present invention is not precluded from being practiced with respect to a polycrystalline silicon semiconductor substrate (or a polycrystalline silicon layer within a microelectronic fabrication which serves as a "silicon semiconductor substrate") or an amorphous silicon semiconductor substrate (or an amorphous silicon layer within a microelectronic fabrication which serves as a "silicon semiconductor substrate") processed within the thermal processing reactor chamber. Thus, although the present invention provides particular value with respect to a silicon semiconductor substrate employed within a semiconductor integrated circuit microelectronic fabrication, the present invention may also be employed with respect to silicon substrates employed within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring again to FIG. 1, the silicon semiconductor substrate upon which is practiced the method of the present invention is first maintained at 800 degrees centigrade the reactor chamber within either a nitrogen atmosphere or a low oxygen concentration oxygen-nitrogen atmosphere (typically and preferably having an oxygen concentration less than about 0.5 s/m and more typically and preferably less than about 0.2 s/m). Although the preferred embodiment of the present invention illustrates the present invention within the context of the nitrogen atmosphere or the low oxygen concentration oxygen-nitrogen atmosphere, there may also be employed within the context of the present invention an alternative inert gas atmosphere at room temperature, such as but not limited to helium, neon, argon and/or krypton atmosphere (or other inert atmospheres as are disclosed within the related art references cited within the Description of the Related Art, the disclosures of all of which relates art references are incorporated herein by reference), although such inert gases are typically not preferred for use within the present invention for economic reasons. Typically and preferably, the flow rate of the nitrogen atmosphere, low oxygen concentration oxygen-nitrogen atmosphere or inert atmosphere is from about 10 to about 20 standard liter per minute (s/m), similarly with the flow rates for atmospheres employed within all processing steps within the method of the present invention.

Referring again to FIG. 1, and at a time T1, a temperature within a reactor chamber within which is positioned the silicon semiconductor substrate upon which is practiced the present invention is ramped up to a first temperature preferably from about 900 to about 950 degrees centigrade, more preferably from about 910 to about 940 degrees centigrade and most particularly from about 920 to about 930 degrees centigrade within a time period T2–T1 preferably from about 30 to about 20 minutes, more preferably from about 28 to about 22 minutes and most preferably from about 26 to about 24 minutes.

Referring again to FIG. 1, and after having reached the first temperature of from about 900 to about 950 degrees centigrade, and in order to form in part the sacrificial silicon oxide layer of the present invention upon the silicon semiconductor substrate which is positioned within the reactor chamber, the nitrogen atmosphere or low oxygen concentration oxygen-nitrogen atmosphere is replaced with an oxygen atmosphere or a high oxygen concentration oxygen-nitrogen atmosphere, where the high oxygen concentration oxygen-nitrogen atmosphere typically and preferably has an oxygen concentration of greater than about 0.2 s/m, more preferably greater than about 0.5 s/m and most preferably greater than about 1 s/m. As an alternative within the present invention there may also be employed oxidant atmospheres comprising oxidants including but not limited to ozone, nitrous oxide and nitric oxide oxidant atmospheres (as well as oxidant atmospheres as are disclosed within the cited related art references). As is illustrated within the schematic diagram of FIG. 1, within the presence of the oxygen or high oxygen concentration oxygen-nitrogen atmosphere, the silicon semiconductor substrate is oxidized at the temperature of from about 900 to about 950 degrees centigrade for a time period preferably from about 10 to about 40 minutes, more preferably from about 15 to about 35 minutes and most preferably from about 20 to about 30 minutes, to form a sacrificial silicon oxide layer of thickness preferably from about 30 to about 70 angstroms, more preferably from about 40 to about 60 angstroms and most preferably about 50 angstroms, upon the silicon semiconductor substrate.

Referring again to FIG. 1, after having formed the sacrificial silicon oxide layer of thickness from about 30 to about 70 angstroms upon the silicon semiconductor substrate through thermal oxidation at the temperature of from about 900 to about 950 degrees centigrade for the time period of from about 10 to about 40 minutes within the time interval T3–T2, the temperature of the reactor chamber is again ramped up, to a second temperature preferably from about 1075 to about 1125 degrees centigrade, more preferably from about 1085 to about 1115 degrees centigrade and most preferably from about 1090 to about 1110 degrees centigrade, within a time interval T4–T3 preferably from about 10 to about 20 minutes, more preferably from about 12 to about 18 minutes and most preferably from about 14 to about 16 minutes. As is illustrated within the schematic process description diagram of FIG. 1, the ramp up from the temperature of from about 900 to about 950 degrees centigrade to the temperature of from about 1075 to about 1125 degrees centigrade is preferably also undertaken within a nitrogen atmosphere, a low oxygen concentration oxygen-nitrogen atmosphere or an inert atmosphere in accord with the nitrogen atmosphere, the low oxygen concentration oxygen-nitrogen atmosphere or the inert atmosphere employed during the first ramp up in temperature from 800 degrees centigrade to the first temperature of about 900 to about 925 degrees centigrade.

Referring again to FIG. 1, and while held at the second temperature of from about 1075 to about 1125 degrees centigrade, the silicon semiconductor substrate is again thermally oxidized, and again within an oxygen or high oxygen concentration oxygen-nitrogen atmosphere, to form upon the silicon semiconductor substrate from the sacrificial silicon oxide layer of thickness from about 40 to about 80 angstroms a further oxidized sacrificial silicon oxide layer. This further oxidation of the sacrificial silicon oxide layer to form the further oxidized sacrificial silicon oxide layer is undertaken for a time period preferably from about 10 to about 20 minutes, more preferably from about 12 to about 18 minutes and most preferably from about 14 to about 16 minutes, interposed between the time intervals T4 and T5, to provide an additional thickness of the further oxidized sacrificial silicon oxide layer with respect to the sacrificial silicon oxide layer, of from about 40 to about 80 angstroms, more preferably from about 50 to about 70 angstroms and most preferably about 60 angstroms.

Referring again to the schematic process description diagram of FIG. 1, and after having formed upon the silicon semiconductor substrate from the sacrificial silicon oxide layer the further oxidized sacrificial silicon oxide layer, the temperature of the reactor chamber is ramped back down to 800 degrees centigrade over a time interval T6–T5 from about 90 to about 210 minutes, more preferably from about 110 to about 190 minutes and most preferably from about 130 to about 170 minutes. As is also illustrated within the schematic process description diagram of FIG. 1, and incident to ramping down the temperature of the reactor chamber from the second temperature of from about 1075 to about 1125 degrees centigrade to 800 degrees centigrade, there is again employed the nitrogen atmosphere, the low oxygen concentration oxygen-nitrogen atmosphere or the inert atmosphere as employed within the ramp up to the first temperature of from about 900 to about 950 degrees centigrade or the ramp up to the second temperature of from about 1075 to about 1125 degrees centigrade.

Referring again to FIG. 1, and in accord with the dashed line which corresponds with reference numeral 8, and in the alternative of an immediate ramping down from the second temperature of from about 1075 to about 1125 degrees centigrade to 800 degrees centigrade within the nitrogen atmosphere, the low oxygen concentration oxygen-nitrogen atmosphere or the inert atmosphere, there may first be further annealed the semiconductor substrate having formed thereupon the further oxidized sacrificial silicon oxide layer within the nitrogen atmosphere, the low oxygen concentration oxygen-nitrogen atmosphere or the inert atmosphere for a time period preferably from about 90 to about 210 minutes, more preferably from about 110 to about 190 minutes and most preferably from about 130 to about 210 minutes within the time interval T6–T5 within the nitrogen atmosphere, the low oxygen concentration oxygen-nitrogen atmosphere or the inert atmosphere, prior to ramping down to room temperature.

Upon: (1) forming the further oxidized sacrificial silicon oxide layer upon a silicon semiconductor substrate through thermal oxidation processing in accord with the schematic process description diagram of FIG. 1; (2) stripping from the silicon semiconductor substrate the further oxidized sacrificial silicon oxide layer; and (3) further fabricating the silicon semiconductor substrate, such as, for example and without limitation, to form therein and/or thereupon a series of microelectronic devices, there is formed with respect to the silicon semiconductor substrate a microelectronic fabrication with enhanced performance insofar as there was employed when forming the further oxidized sacrificial silicon oxide layer a two step thermal oxidizing method, in particular in comparison with a comparatively lower temperature one step thermal oxidizing method.

Referring now to FIG. 2 to FIG. 7, there is shown a series of schematic cross-sectional diagrams illustrating the results of progressive stages of fabricating a semiconductor integrated circuit microelectronic fabrication having formed therein a sacrificial silicon oxide layer in accord with the preferred embodiment of the present invention.

Figure 2:
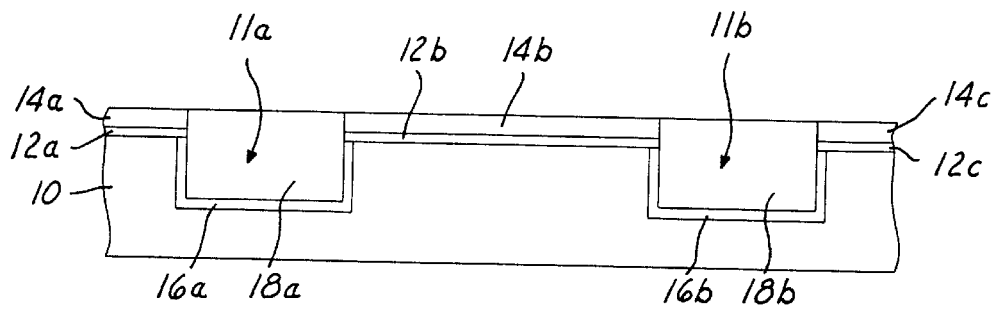
FIG. 2, FIG. 3, FIG. 4, FIG. 5, FIG. 6 and FIG. 7 show a series of schematic cross-sectional diagrams illustrating the results of progressive stages of fabricating a semiconductor integrated circuit microelectronic fabrication having formed therein a sacrificial silicon oxide layer in accord with the preferred embodiment of the present invention.

Shown in FIG. 2 is a schematic cross-sectional diagram of the semiconductor integrated circuit microelectronic fabrication at an early stage in its fabrication in accord with the preferred embodiment of the present invention.

Shown in FIG. 2, in a first instance, is a silicon semiconductor substrate 10 having formed therein a pair of shallow isolation trenches 11a and 11b.

Within the preferred embodiment of the present invention with respect to the silicon semiconductor substrate 10, and although it is known in the art of semiconductor integrated circuit microelectronic fabrication that silicon semiconductor substrates are available with either dopant polarity, several dopant concentrations and various crystallographic orientations, for the preferred embodiment of the present invention the silicon semiconductor substrate 10 is typically and preferably a (100) silicon semiconductor substrate having an N- or P- doping concentration of from about 1E13 to about 1E16 dopant atoms per cubic centimeter, although the present invention may also be employed with silicon semiconductor substrates and silicon substrates absent dopants incorporated therein.

Within the preferred embodiment of the present invention with respect to the pair of shallow isolation trenches 11a and 11b formed within the silicon semiconductor substrate 10, the pair of shallow isolation trenches 11a and 11b is typically and preferably formed of a minimum linewidth of from about 0.13 to about 0.18 microns and a depth of from about 3000 to about 6000 angstroms to provide a bidirectional array of shallow isolation trenches which define a bidirectional array of active regions of the silicon semiconductor substrate 10 of minimum bidirectional linewidth from about 0.13 to about 0.18 microns, as illustrated in part within the schematic cross-sectional diagram of FIG. 2.

Shown also within the schematic cross-sectional diagram of FIG. 2, and defining each of the pair of shallow isolation trenches 11a and 11b within the silicon semiconductor substrate 10, is a series of patterned pad oxide layers 12a, 12b and 12c having formed and aligned thereupon a corresponding series of patterned silicon nitride layers 14a, 14b and 14c.

Within the preferred embodiment of the present invention with respect to the series of patterned pad oxide layers 12a, 12b and 12c, the series of patterned pad oxide layers 12a, 12b and 12c is typically and preferably formed employing methods, and in particular thermal oxidation methods, as are conventional in the art of semiconductor integrated circuit microelectronic fabrication, to provide the series of patterned pad oxide layers 12a, 12b and 12c each of thickness from about 90 to about 110 angstroms formed upon the silicon semiconductor substrate 10.

Within the preferred embodiment of the present invention with respect to the series of patterned silicon nitride layers 14a, 14b and 14c, the series of patterned silicon nitride layers 14a, 14b and 14c is similarly also formed employing methods and materials, and in particular chemical vapor deposition (CVD) methods and materials, as are conventional in the art of semiconductor integrated circuit microelectronic fabrication, to form the series of patterned silicon nitride layers 14a, 14b, and 14c each of thickness from about 1000 to about 1800 angstroms upon the corresponding series of patterned pad oxide layers 12a, 12b and 12c.

Shown also within the schematic cross-sectional diagram of FIG. 2 is a pair of patterned silicon oxide trench liner layers 16a and 16b formed within each of the pair of shallow isolation trenches 11a and 11b, and a pair of patterned silicon oxide trench fill layers 18a and 18b formed within the pair of shallow isolation trenches 11a and 11b and upon the pair of patterned silicon oxide trench liner layers 16a and 16b.

Within the preferred embodiment of the present invention with respect to the pair of patterned silicon oxide trench liner layers 16a and 16b, the pair of patterned silicon oxide trench liner layers 16a and 16b is typically and preferably formed employing methods and materials as are analogous or equivalent to the methods and materials as are employed for forming the series of patterned pad oxide layers 12a, 12b and 12c, to thus form the pair of patterned silicon oxide trench liner layers 16a and 16b each of thickness from about 150 to about 250 angstroms within each of the isolation trenches 11a and 11b.

Finally, within the preferred embodiment of the present invention with respect to the pair of patterned silicon oxide trench fill layers 18a and 18b, the pair of patterned silicon oxide trench fill layers 18a and 18b may also be formed employing methods as are conventional in the art of semiconductor integrated circuit microelectronic fabrication, which will typically and preferably include any of several chemical vapor deposition (CVD) methods, to form the pair of patterned silicon oxide trench fill layers 18a and 18b which completely fill each of the pair of shallow isolation trenches 11a and 11b when formed upon the pair of patterned silicon oxide trench liner layers 16a and 16b.

As is understood by a person skilled in the art, the semiconductor integrated circuit microelectronic fabrication whose schematic cross-sectional diagram is illustrated in FIG. 2 is typically and preferably fabricated while employing the series of patterned pad oxide layers 12a, 12b and 12c and the series of patterned silicon nitride layers 14a, 14b and 14c sequentially as an etch mask for forming the pair of shallow isolation trenches 11a and 11b within the silicon semiconductor substrate 10 and then as an oxidation mask for forming the pair of patterned silicon oxide trench liner layers 16a and 16b within the pair of shallow isolation trenches 11a and 11b. Subsequent thereto, a blanket silicon oxide trench fill layer is formed over the semiconductor integrated circuit microelectronic fabrication and filling the pair of isolation trenches 11a and 11b, and then chemical mechanical polish (CMP) planarized to form the pair of patterned silicon oxide trench fill layers 18a and 18b while employing the series of patterned silicon nitride layers 14a, 14b and 14c as a series of chemical mechanical polish (CMP) planarizing stop layers.

Figure 3:
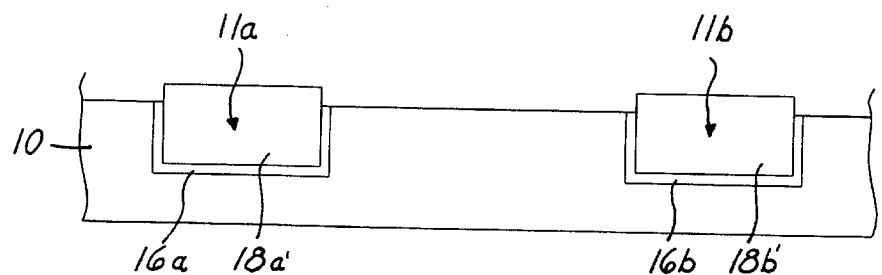

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein: (1) there has been stripped from the series of patterned pad oxide layers 12a, 12b and 12c the series of patterned silicon nitride layers 14a, 14b and 14c; and (2) there has been stripped from the silicon semiconductor substrate 10 the series of patterned pad oxide layers 12a, 12b and 12c.

Within the preferred embodiment of the present invention, the series of patterned silicon nitride layers 14a, 14b and 14c may be stripped from the series of patterned pad oxide layers 12a, 12b and 12c while employing methods and materials as are conventional in the art of semiconductor integrated circuit microelectronic fabrication, which will typically and preferably include, but are not limited to, hot aqueous phosphoric acid stripping methods and materials. Similarly, within the preferred embodiment of the present invention, the series of patterned pad oxide layers 12a, 12b and 12c may similarly also be stripped from the silicon semiconductor substrate 10 while employing methods as are conventional in the art of semiconductor integrated circuit microelectronic fabrication, which will typically and preferably include, but are not limited to, hydrofluoric acid stripping methods and materials and buffered oxide etchant stripping methods and materials.

Shown also within the schematic cross-sectional diagram of FIG. 3 is a pair of partially etched patterned silicon oxide trench fill layers 18a' and 18b' which is typically formed from the pair of patterned silicon oxide trench fill layers 18a and 18b incident to a slight etching thereof simultaneously with stripping from the silicon semiconductor substrate 10 the series of patterned pad oxide layers 12a, 12b and 12c.

Figure 4:
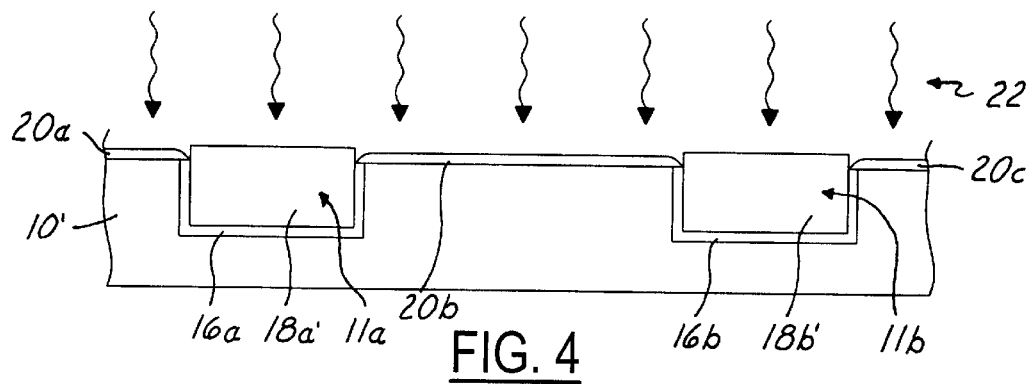

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there is formed upon exposed portions of the silicon semiconductor substrate 10 as illustrated within the schematic cross-sectional diagram of FIG. 3 a series of patterned sacrificial silicon oxide layers 20a, 20b and 20c, incident to thermal annealing within a first thermal oxidizing atmosphere 22, while simultaneously forming from the silicon semiconductor substrate 10 as illustrated within the schematic cross-sectional diagram of FIG. 3 a partially consumed silicon semiconductor substrate 10' as illustrated within the schematic cross-sectional diagram of FIG. 4.

Within the preferred embodiment of the present invention, and in accord with the schematic process description diagram of FIG. 1, the series of patterned sacrificial silicon oxide layers 20a, 20b and 20c is formed employing the first thermal oxidizing atmosphere 22 at a temperature of from about 900 to about 950 degrees centigrade, to form the series of patterned sacrificial silicon oxide layers 20a, 20b and 20c each of a thickness from about 30 to about 70 angstroms.

Figure 5:
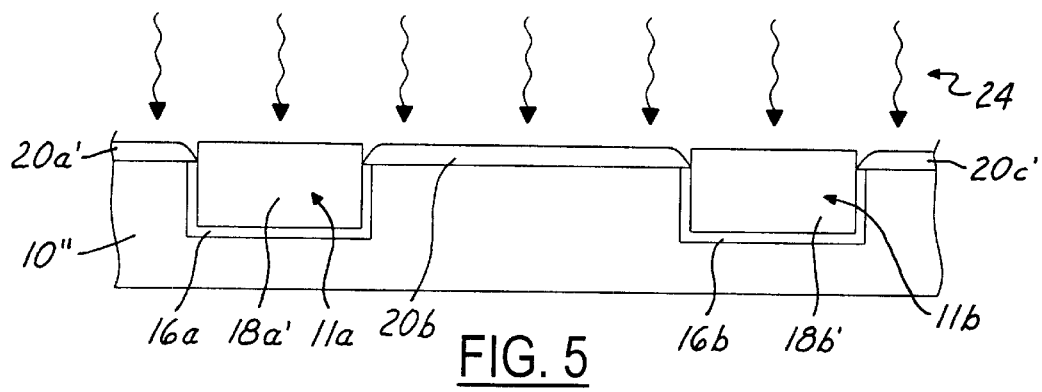

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed from the series of patterned sacrificial silicon oxide layers 20a, 20b and 20c upon the partially consumed silicon semiconductor substrate 10! as illustrated within the schematic cross-sectional diagram of FIG. 4 a series of further oxidized patterned sacrificial silicon oxide layers 20a', 20b' and 20c' upon a further consumed silicon semiconductor substrate 10" through oxidation within a second thermal oxidizing atmosphere 24.

Within the preferred embodiment of the present invention, the series of further oxidized patterned sacrificial silicon oxide layers 20a', 20b' and 20c' as illustrated within the schematic cross-sectional diagram of FIG. 5 is formed from the series of patterned sacrificial silicon oxide layers 20a, 20b and 20c as illustrated within the schematic cross-sectional diagram of FIG. 4 while employing the second thermal oxidizing atmosphere 24 employing the second temperature of from about 1075 to about 1125 degrees centigrade as illustrated within the schematic process description diagram of FIG. 1, to provide the additional thickness of the series of further oxidized patterned sacrificial silicon oxide layers 20a', 20b' and 20c' with respect to the series of patterned sacrificial silicon oxide layers 20a, 20b and 20c of from about 40 to about 80 angstroms. As is further illustrated within the schematic cross-sectional diagrams of FIG. 4 and FIG. 5, the series of patterned sacrificial silicon oxide layers 20a, 20b and 20c is not masked when forming therefrom the series of further oxidized patterned sacrificial silicon oxide layers 20a', 20b' and 20c', and thus each of the series of further oxidized patterned sacrificial silicon oxide layers 20a', 20b' and 20c' is inherently formed of a nominally uniform thickness.

Figure 6:
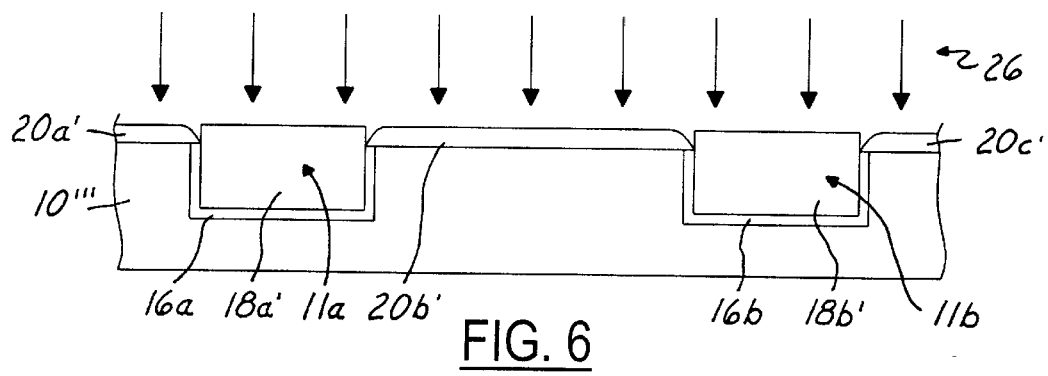

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein the further consumed silicon semiconductor substrate 10" as illustrated within the schematic cross-sectional diagram of FIG. 5 is ion implanted with a dose of implanting ions 26 while employing the series of further oxidized patterned sacrificial silicon oxide layers 20a', 20b' and 20c' as a mask, to form therefrom an ion implanted further consumed silicon semiconductor substrate 10'''.

Within the preferred embodiment of the present invention, the dose of implanting ions 26 may be provided of either, or alternatively no, dopant polarity. Typically and preferably the dose of implanting ions 26 is provided at an ion implantation dose of from about 3E12 to about 2E13 dopant ions per square centimeter and an ion implantation energy of from about 20 to about 400 kev to form within the ion implanted further consumed silicon semiconductor substrate 10''' an ion implant structure selected from the group including but not limited to dopant well ion implant structures, field ion implant structures and threshold voltage ion implant structures.

Figure 7:
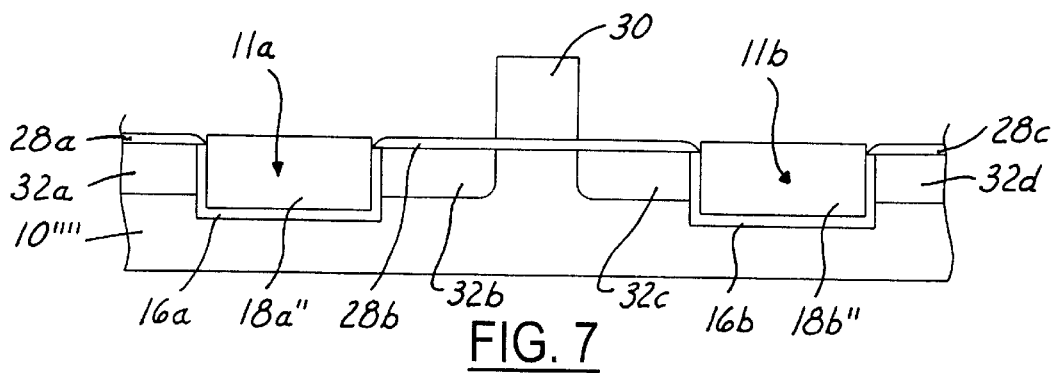

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein, in a first instance, the series of further oxidized patterned sacrificial silicon oxide layers 20a', 20b' and 20c' has been stripped from the ion implanted further consumed silicon semiconductor substrate 10''' while simultaneously further etching the pair of partially etched patterned silicon oxide trench fill layers 18a' and 18b' to form a pair of further etched patterned silicon oxide trench fill layers 18a" and 18b".

Within the preferred embodiment of the present invention, the series of further oxidized patterned sacrificial silicon oxide layers 20a', 20b' and 20c' may be stripped from the ion implanted further consumed silicon semiconductor substrate 10''' as illustrated within the schematic cross-sectional diagram of FIG. 6 while simultaneously further etching the pair of partially etched patterned silicon oxide trench fill layers 18a' and 18b' to form the pair of further etched patterned silicon oxide trench fill layers 18a" and 18b", to provide in part the semiconductor integrated circuit microelectronic fabrication whose schematic cross-sectional diagram is illustrated in FIG. 7 while employing stripping methods and materials as are otherwise analogous or equivalent to the stripping methods and materials as are employed for stripping from the semiconductor integrated microelectronic fabrication whose schematic cross-sectional diagram is illustrated in FIG. 2 the series of patterned pad oxide layers 12a, 12b and 12c to provide in part the semiconductor integrated circuit microelectronic fabrication whose schematic cross-sectional diagram is illustrated in FIG. 3.

Shown also within the schematic cross-sectional diagram of FIG. 7 formed upon exposed portions of the ion implanted further consumed silicon semiconductor substrate 10''' after having stripped therefrom the series of further oxidized patterned sacrificial silicon oxide layers 20a', 20b' and 20c' is: (1) a series of patterned gate dielectric layers 28a, 28b and 28c of which; (2) the gate dielectric layer 28b in turn has formed thereupon a gate electrode 30; and (3) wherein there is further formed within portions of the ion implanted further consumed silicon semiconductor substrate 10''' as illustrated within the schematic cross-sectional diagram of FIG. 6 a series of source/drain regions 32a, 32b, 32c and 32d, to form therefrom a further ion implanted yet further consumed silicon semiconductor substrate 10''''.

Within the preferred embodiment of the present invention with respect to the series of patterned gate dielectric layers 28a, 28b and 28c, the series of patterned gate dielectric layers 28a, 28b and 28c may be formed employing methods and materials as are otherwise generally conventional in the art of semiconductor integrated circuit microelectronic fabrication, including but not limited to gate dielectric layer deposition/patterning methods and gate dielectric layers thermal oxidation methods, but preferably gate dielectric layer thermal oxidation methods, to form the series of patterned gate dielectric layers 28a, 28b and 28c, each of thickness from about 20 to about 50 angstroms formed upon the further ion implanted yet further consumed silicon semiconductor substrate 10"".

Within the preferred embodiment of the present invention with respect to the gate electrode 30, the gate electrode 30 may be formed employing methods and materials as are also conventional in the art of semiconductor integrated circuit microelectronic fabrication, including but not limited to metal, metal alloy, doped polysilicon (having a dopant concentration of greater than about 1E18 dopant atoms per cubic centimeter and polycide (doped polysilicon/metal silicide stack) conductor materials. Typically and preferably, the gate electrode is formed to a thickness of from about 1500 to about 2500 angstroms and a linewidth of from about 0.1 µm to about 0.18 µm upon the patterned gate dielectric layer 28b.

Finally, within the preferred embodiment of the present invention with respect to the source/drain regions 32a, 32b, 32c and 32d, the series of source/drain regions 32a, 32b, 32c and 32d is typically and preferably also formed employing methods, preferably ion implant methods, as are also conventional in the art of semiconductor integrated circuit microelectronic fabrication, to provide the series of source/drain regions 32a, 32b, 32c and 32d of appropriate dopant concentrations within the further ion implanted yet further consumed silicon semiconductor substrate 10"".

Upon forming the semiconductor integrated circuit microelectronic fabrication whose schematic cross-sectional diagram is illustrated in FIG. 7, there is formed in accord with the preferred embodiment of the present invention a semiconductor integrated circuit microelectronic fabrication having formed therein a field effect transistor (FET) device comprising the gate electrode 30 formed upon the patterned gate dielectric layer 28b in turn formed upon an active region of the further ion implanted yet further consumed silicon semiconductor substrate 10"" having formed therein the pair of source/drain regions 32a and 32b, wherein the field effect transistor (FET) device is formed with enhanced performance. The field effect transistor (FET) device is formed within the semiconductor integrated circuit microelectronic fabrication whose schematic cross-sectional diagram is illustrated in FIG. 7 with enhanced performance insofar as prior to forming the field effect transistor (FET) device there is formed upon a portion of the silicon semiconductor substrate within which is formed the field effect transistor (FET) device a sacrificial silicon oxide layer formed employing a two step thermal oxidizing method.

EXAMPLE

In order to demonstrate the value of the present invention, there was fabricated a series of four semiconductor integrated circuit microelectronic fabrications generally in accord with the semiconductor integrated circuit microelectronic fabrication whose schematic cross-sectional diagram is illustrated in FIG. 3, while employing methods, materials and dimensions analogous or equivalent to the methods, materials and dimensions as disclosed within the preferred embodiment of the present invention for fabricating the semiconductor integrated circuit microelectronic fabrication whose schematic cross-sectional diagram is illustrated in FIG. 3.

Upon a first of four silicon semiconductor substrates within the series of four semiconductor integrated circuit microelectronic fabrications there was then formed a sacrificial silicon oxide layer to a thickness of about 110 angstroms while employing a thermal oxidizing method employing a single temperature of about 920 degrees centigrade, without any subsequent annealing, otherwise generally in accord with the schematic process description diagram of FIG. 1.

Upon a second of the four silicon semiconductor substrates within the series of four semiconductor integrated circuit microelectronic fabrications there was formed a sacrificial silicon oxide layer otherwise in accord with the sacrificial silicon oxide layer formed upon the first of the four silicon semiconductor substrates within the series of four semiconductor integrated circuit microelectronic fabrications, but wherein the silicon semiconductor substrate, and the sacrificial silicon oxide layer formed thereupon, were further annealed in a nitrogen atmosphere at a temperature of about 1100 degrees centigrade, for a time period of about 120 minutes.

Upon a third of the four silicon semiconductor substrates within the series of four semiconductor integrated circuit microelectronic fabrications there was formed a sacrificial silicon oxide layer in accord with the preferred embodiment of the present invention. The sacrificial silicon oxide layer was formed employing a first thermal oxidizing method at a temperature of about 920 degrees centigrade to form upon the silicon semiconductor substrate a sacrificial silicon oxide layer of thickness about 50 angstroms followed by a second thermal oxidizing method at a temperature of about 1100 degrees centigrade to form upon the silicon semiconductor substrate from the sacrificial silicon oxide layer a further oxidized sacrificial silicon oxide layer of thickness about 60 angstroms.

Upon a fourth of the four silicon semiconductor substrates within the series of four semiconductor integrated circuit microelectronic fabrications was formed a sacrificial silicon oxide layer otherwise in accord with the sacrificial silicon oxide layer formed upon the third of the four silicon semiconductor substrates, but wherein the sacrificial silicon oxide layer was further annealed in a nitrogen atmosphere at a temperature of about 1100 degrees centigrade for a time period of about 120 minutes.

The series of four sacrificial silicon oxide layers were then stripped from the series of four silicon semiconductor substrates and there was then formed upon a series of active regions of the four silicon semiconductor substrates a series of field effect transistor (FET) devices in accord with the field effect transistor (FET) device whose schematic cross-sectional diagram is illustrated in FIG. 7, while employing methods and materials in accord with the preferred embodiment of the present invention.

There was then measured for the series of field effect transistor (FET) devices formed within the series of active regions of the series of four silicon semiconductor substrates a series of standby currents with respect to a series of static dynamic random access memory (SRAM) integrated circuits within which was fabricated the series of field effect transistor (FET) devices within the four silicon semiconductor substrates. Measured values of the standby currents are reported in Table I, as follows, where a lower value of a standby current is indicative of enhanced field effect transistor (FET) device performance.

TABLE I

| Sacrificial Silicon Oxide Processing | Standby Current |
| --- | --- |
| 110 A @ 920 C | 31 uA |
| 110 A @ 920 C + Anneal | 27 uA |

TABLE I-continued

| Sacrificial Silicon Oxide Processing | Standby Current |
|---|---|
| 50 A @ 920 C + 60 A @ 1100 C | 29 uA |
| 50 A @ 920 C + 60 A @ 1100 C + Anneal | 23 uA |

As is seen from review of the data in Table I, a two step thermal oxidizing method for forming a sacrificial silicon oxide layer in accord with the present invention provides a sacrificial silicon oxide layer which once stripped from a silicon semiconductor substrate upon which is was formed provides a silicon semiconductor substrate within and upon which there may be formed microelectronic devices, and in particular field effect transistor (FET) devices, with enhanced performance. The present invention realizes the foregoing object by employing when forming the sacrificial silicon oxide layer a two step thermal oxidizing method wherein a first step within the two step thermal oxidizing method is undertaken at a lower temperature than a second step within the two step thermal oxidizing method.

It is believed within the present invention that the first step within the two step thermal oxidizing method is undertaken at a temperature sufficiently low, and within an appropriate thermal oxidizing atmosphere, to avoid nitride formation within the sacrificial silicon oxide layer, while the second step within the two step method is undertaken at a temperature sufficiently high to provide for reflow of the sacrificial silicon oxide layer and thus attenuated dislocation with the silicon semiconductor substrate from which is formed the sacrificial silicon oxide layer. Such attenuated dislocation is particularly important within the context of the preferred embodiment of the present invention under circumstances where an active region of a semiconductor is isolated by a shallow trench isolation region, which presumably provides for greater susceptibility within the active region of the semiconductor substrate isolated by the shallow trench isolation region of dislocation defects.

As is understood by a person skilled in the art, the preferred embodiment and example of the present invention are illustrative of the present invention rather than limiting of the present invention. Revisions and modifications may be made to methods, materials, structures and dimensions through which is fabricated a sacrificial silicon oxide layer within a semiconductor integrated circuit microelectronic fabrication in accord with the preferred embodiment and example of the present invention while still fabricating a sacrificial silicon oxide layer within a microelectronic fabrication in accord with the present invention, further in accord with the accompanying claims.

What is claimed is:

1. A method for forming a sacrificial silicon oxide layer comprising:

providing a silicon semiconductor substrate;

thermally oxidizing the silicon semiconductor substrate at a first temperature within a first oxidizing atmosphere to form a silicon oxide layer upon a partially consumed silicon semiconductor substrate formed from the silicon semiconductor substrate;

thermally oxidizing the partially consumed silicon semiconductor substrate at a second temperature greater than the first temperature, and within a second oxidizing atmosphere, and further absent a mask layer formed thereover, to form from the silicon oxide layer upon the partially consumed silicon semiconductor substrate a further oxidized silicon oxide layer upon a further consumed silicon semiconductor substrate; and stripping from the further consumed silicon semiconductor substrate the further oxidized silicon oxide layer.

2. The method of claim 1 wherein the silicon semiconductor substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the silicon semiconductor substrate is formed from a silicon material selected from the group consisting of amorphous silicon materials, polycrystalline silicon materials and monocrystalline silicon materials.

4. The method of claim 1 wherein the silicon semiconductor substrate is formed of a monocrystalline silicon material.

5. The method of claim 1 wherein the first temperature is from about 900 to about 950 degrees centigrade.

6. The method of claim 1 wherein the second temperature is from about 1075 to about 1125 degrees centigrade.

7. The method of claim 1 wherein each of the first oxidizing atmosphere and the second oxidizing atmosphere comprises an oxidant selected from the group consisting of oxygen, ozone, nitrous oxide and nitric oxide.

8. The method of claim 1 further comprising forming within the further consumed silicon semiconductor substrate after having stripped therefrom the further oxidized silicon oxide layer a microelectronic device.

9. The method of claim 8 wherein the microelectronic device is selected from the group consisting of resistors, transistors, diodes and capacitors.

10. The method of claim 8 wherein the microelectronic device is selected from the group consisting of field effect devices, junction devices and passive devices.

11. The method of claim 8 wherein by employing the two step thermal oxidizing method for forming the further oxidized silicon oxide layer, the microelectronic device is formed with enhanced performance.

12. The method of claim 1 wherein prior to stripping from the further consumed silicon semiconductor substrate the further oxidized silicon oxide layer, the further oxidized silicon oxide layer is employed as a mask layer with respect to the further consumed silicon semiconductor substrate.

13. The method of claim 12 wherein the mask layer is selected from the group consisting of ion implant mask layers and gettering mask layers.

14. The method of claim 1 further comprising subsequent to thermally oxidizing the partially consumed silicon semiconductor substrate at the second temperature greater than the first temperature and before stripping from the further consumed silicon semiconductor substrate the further oxidized silicon oxide layer further annealing the further consumed silicon semiconductor substrate and the further oxidized silicon oxide layer.

15. The method of claim 14 wherein the further annealing is undertaken at a temperature of from about 1075 to about 1125 degrees centigrade.

* * * * *